US008614479B2

United States Patent
Weng et al.

(10) Patent No.: US 8,614,479 B2
(45) Date of Patent: Dec. 24, 2013

(54) VERTICAL TRANSISTOR STRUCTURE

(75) Inventors: Shou-Cheng Weng, Changhua County (TW); Huai-An Li, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 241 days.

(21) Appl. No.: 13/046,706

(22) Filed: Mar. 12, 2011

(65) Prior Publication Data
US 2012/0161228 A1 Jun. 28, 2012

(30) Foreign Application Priority Data
Dec. 22, 2010 (TW) ................................ 99145277 A

(51) Int. Cl.
*H01L 29/66* (2006.01)
(52) U.S. Cl.
USPC ........... 257/328; 257/302; 257/329; 257/331; 257/E29.262
(58) Field of Classification Search
USPC .................................. 257/331, E29.262, 328
See application file for complete search history.

(56) References Cited

U.S. PATENT DOCUMENTS

| 6,018,176 A | 1/2000 | Lim |
| 2008/0173928 A1 | 7/2008 | Arai et al. |
| 2011/0024816 A1* | 2/2011 | Moon et al. .................... 257/314 |

OTHER PUBLICATIONS

"Office Action of China Counterpart Application", issued on Oct. 10, 2012, p. 1-p. 4.
"Office Action of Taiwan Counterpart Application", issued on May 17, 2013, p. 1-p. 5.

* cited by examiner

*Primary Examiner* — Hsin-Yi Hsieh
(74) *Attorney, Agent, or Firm* — Jianq Chyun IP Office

(57) ABSTRACT

A vertical transistor structure includes a substrate, a source, a first gate, a first insulating layer, a second gate, a gate insulating layer, a drain, a second insulating layer, and a semiconductor channel layer. The source is configured on the substrate. The first gate is configured on the source and has at least one first through hole. The first insulating layer is between the first gate and the source. The second gate is configured on the first gate and has at least one second through hole. The gate insulating layer is between the first and second gates and has at least one third through hole. The first, second, and third through holes are communicated with one another. The drain is configured on the second gate. The second insulating layer is configured between the second gate and the drain. The semiconductor channel layer fills the first, second, and third through holes.

9 Claims, 1 Drawing Sheet

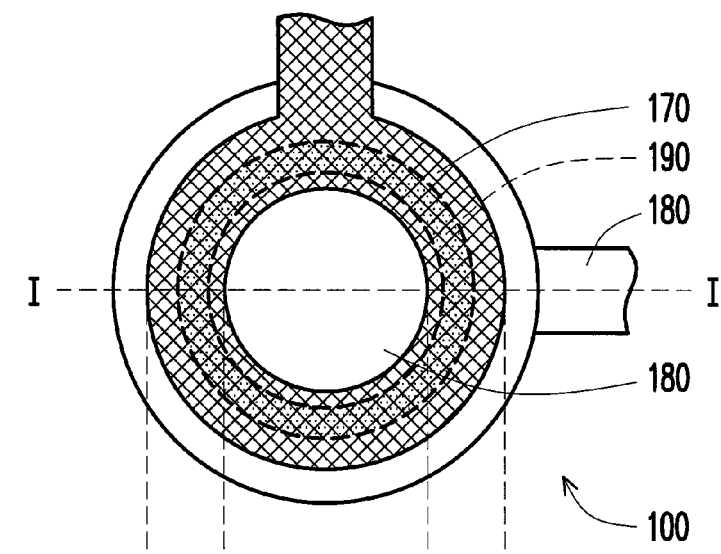
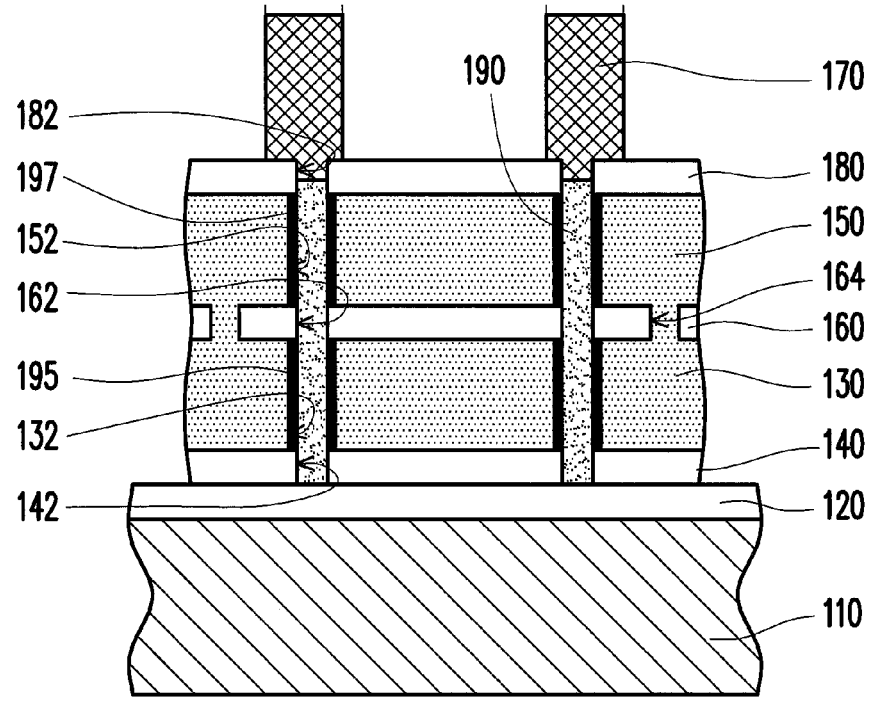
FIG. 1A
FIG. 1B

VERTICAL TRANSISTOR STRUCTURE

CROSS-REFERENCE TO RELATED APPLICATION

This application claims the priority benefit of Taiwan application serial no. 99145277, filed on Dec. 22, 2010. The entirety of the above-mentioned patent application is hereby incorporated by reference herein and made a part of this specification.

BACKGROUND OF THE INVENTION

1. Field of the Invention

The invention relates to a transistor structure. More particularly, the invention relates to a vertical transistor structure.

2. Description of Related Art

In order to accelerate the operating speed of integrated circuits and to meet customers' demands for miniaturizing electronic devices, physical dimensions of transistors in a semiconductor device tend to be reduced. With the reduction of the physical dimensions of transistors, the length of channel regions in the transistors is also reduced. Thereby, a severe short channel effect is likely to occur in the transistors, and an ON current of the transistors may decrease. A conventional solution to said issue is to enhance the dopant concentration in the channel regions. Nevertheless, this solution gives rise to an increase in the leakage current and therefore affects the reliability of devices.

Hence, to resolve said issue, a conventional horizontal transistor structure has been replaced by a vertical transistor structure in the industry. As such, the operating speed and integration of the integrated circuits are enhanced, and problems including the short channel effect are resolved. For instance, as disclosed by Fujimoto Kiyoshi et al. in Advanced Materials in 2007, a vertical organic thin film transistor (OTFT) can be formed due to the electrostatic repulsion between the polystrene particles that function as a blocking board. However, in the vertical OTFT, a depletion layer serving as an insulating layer is formed at the contact interface between aluminum and a semiconductor layer, and therefore voltages cannot be excessively applied. Besides, in the vertical OTFT, an ON-OFF current ratio is rather small, and an OFF current is overly high. Consequently, the conventional vertical transistor can still be significantly improved in terms of structural design and channel control, which is one of the main research topics in this industry.

SUMMARY OF THE INVENTION

The invention is directed to a vertical transistor structure that has a relatively high ON current and can effectively reduce an OFF current.

In an embodiment of the invention, a vertical transistor structure including a substrate, a source, a first gate, a first insulating layer, a second gate, a gate insulating layer, a drain, a second insulating layer, and a semiconductor channel layer is provided. The source is configured on the substrate. The first gate is configured on the source and has at least one first through hole. The first through hole penetrates the first gate. The first insulating layer is configured between the first gate and the source. The second gate is configured on the first gate and has at least one second through hole. The second through hole penetrates the second gate. The gate insulating layer is configured between the first gate and the second gate and has at least one third through hole. The third through hole penetrates the gate insulating layer, and the first through hole, the second through hole, and the third through hole are communicated with one another. The drain is configured on the second gate. The second insulating layer is configured between the second gate and the drain. The semiconductor channel layer fills the first, second, and third through holes.

According to an embodiment of the invention, the first insulating layer has at least one fourth through hole, and a portion of the semiconductor channel layer further extends into the fourth through hole.

According to an embodiment of the invention, the second insulating layer has at least one fifth through hole, a portion of the semiconductor channel layer further extends into the fifth through hole, and a portion of the drain is connected to the portion of the semiconductor channel layer in the fifth through hole.

According to an embodiment of the invention, the vertical transistor structure further includes a first passivation layer configured on an inner wall of the first through hole.

According to an embodiment of the invention, a material of the first passivation layer includes aluminum oxide.

According to an embodiment of the invention, the vertical transistor structure further includes a second passivation layer configured on an inner wall of the second through hole.

According to an embodiment of the invention, a material of the second passivation layer includes aluminum oxide.

According to an embodiment of the invention, the gate insulating layer further has at least one contact window, and the first gate and the second gate are connected through the contact window.

According to an embodiment of the invention, the semiconductor channel layer is in a ring shape.

According to an embodiment of the invention, the source is in a ring shape.

Based on the above, in the vertical transistor structure described in the embodiments of the invention, the semiconductor channel layer fills the through hole of the first gate, the through hole of the second gate, and the through hole of the gate insulating layer. Here, the through holes refer to the first, second, and third through holes which are communicated with one another. Thereby, the vertical transistor structure can have a relatively high ON current and can effectively reduce an OFF current.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A is a schematic top view illustrating a vertical transistor structure according to an embodiment of the invention.

FIG. 1B is a schematic cross-sectional view illustrating the vertical transistor structure taken along a line I-I depicted in FIG. 1A.

DESCRIPTION OF EMBODIMENTS

FIG. 1A is a schematic top view illustrating a vertical transistor structure according to an embodiment of the invention. FIG. 1B is a schematic cross-sectional view illustrating the vertical transistor structure taken along a line I-I depicted in FIG. 1A. With reference to FIG. 1A and FIG. 1B, in this embodiment, the vertical transistor structure 100 includes a substrate 110, a source 120, a first gate 130, a first insulating layer 140, a second gate 150, a gate insulating layer 160, a drain 170, a second insulating layer 180, and a semiconductor channel layer 190. The substrate 110 of this embodiment is a flexible substrate or a rigid substrate, for instance. Here, a material of the flexible substrate is polyester polymer (e.g., PET) or polyimide, and a material of the rigid substrate is glass, for instance.

To be more specific, the source 120 is configured on the substrate 110 and is made of indium tin oxide (ITO), for instance. The first gate 130 is configured on the source 120 and has at least one first through hole 132. The first through hole 132 penetrates the first gate 130. In this embodiment, the first gate 130 is made of aluminum or other metallic materials, for instance, and the thickness of the first gate 130 is approximately 60 nm, for instance. The first insulating layer 140 is configured between the first gate 130 and the source 120. Besides, the first insulating layer 140 has at least one fourth through hole 142 communicating with the first through hole 132. In addition, the first insulating layer 140 is made of SiOx, for instance, and the thickness of the first insulating layer 140 is approximately 50 nm, for instance.

The second gate 150 is configured on the first gate 130 and has at least one second through hole 152. The second through hole 152 penetrates the second gate 150. In this embodiment, the second gate 150 is made of aluminum or other metallic materials, for instance, and the thickness of the second gate 150 is approximately 60 nm, for instance. The gate insulating layer 160 is configured between the first gate 130 and the second gate 150 and has at least one third through hole 162. The third through hole 162 penetrates the gate insulating layer 160. The first through hole 132, the second through hole 152, the third through hole 162, and the fourth through hole 142 are communicated with one another. According to this embodiment, the gate insulating layer 160 is made of SiOx, for instance, and the thickness of the gate insulating layer 160 is approximately 50 nm, for instance.

The drain 170 is configured on the second gate 150, and a material of the drain 170 includes gold, aluminum, or ITO. The second insulating layer 180 is configured between the second gate 150 and the drain 170. Here, the second insulating layer 180 has at least one fifth through hole 182. The fifth through hole 182, the first through hole 132, the second through hole 152, the third through hole 162, and the fourth through hole 142 are communicated with one another. In addition, the second insulating layer 180 is made of SiOx, for instance, and the thickness of the second insulating layer 180 is approximately 50 nm, for instance.

The semiconductor channel layer 190 fills the first through hole 132, the second through hole 152, and the third through hole 162. A portion of the semiconductor channel layer 190 further extends into the fourth through hole 142 and the fifth through hole 182 and fills the fourth through hole 142. A portion of the drain 170 is connected to the portion of the semiconductor channel layer 190 in the fifth through hole 182 according to this embodiment. Besides, a material of the semiconductor channel layer 190 described in this embodiment includes an organic semiconductor material (e.g., pentacene) or an inorganic semiconductor material (e.g., indium gallium zinc oxide (IGZO), ZnO, amorphous silicon (a-Si), or crystal silicon (crystal Si)). Particularly, in this embodiment, the semiconductor channel layer 190 is, for instance, in a ring shape, and so is the drain 170, for instance.

In this embodiment, the semiconductor channel layer 190 fills the first through hole 132 of the first gate 130, the second through hole 152 of the second gate 150, and the third through hole 162 of the gate insulating layer 160. Therefore, by modifying the thickness of the first gate 130 and the second gate 150, the length of the semiconductor channel layer 190 can be adjusted, so as to prevent the short channel effect caused by the reduction of the physical dimensions of devices. Moreover, the vertical transistor structure 100 described in this embodiment can have a relatively high ON current and can effectively reduce the OFF current. According to this embodiment, since the semiconductor channel layer 190 fills the first through hole 132, the second through hole 152, and the third through hole 162, it is not necessary to form an etching stop layer for protecting the semiconductor channel layer 190 from being etched by etchant in the subsequent processes. As such, the manufacturing process of the vertical transistor structure 100 can be simplified, and the production costs can be lowered down.

The vertical transistor structure 100 of this embodiment further includes a first passivation layer 195 and a second passivation layer 197. The first passivation layer 195 is configured on an inner wall of the first through hole 132, and the second passivation layer 197 is configured on an inner wall of the second through hole 152. In this embodiment, the first passivation layer 195 and the second passivation layer 197 are made of aluminum oxide, for instance. Here, the first and second passivation layers 195 and 197 are formed by performing an oxidation process on the first gate 130 and the second gate 150 that are exemplarily made of metallic materials (e.g., aluminum), so as to form aluminum oxide on the inner walls of the first and second through holes 132 and 152. The oxidation process is an electrochemical oxidation process or is performed with use of oxygen plasma equipment.

That is to say, due to oxidation reaction, the first and second passivation layers 195 and 197 with high density and high dielectric constant can be formed in the first and second gates 130 and 150, so as to expand the range of the voltages applicable to the vertical transistor structure 100 and increase the ON-OFF current ratio. Additionally, the ring-shaped semiconductor channel layer 190 is encircled by the first and second gates 130 and 150, and therefore external electromagnetic or noise interference can be reduced or eliminated. In the vertical transistor structure 100 of this embodiment, the gate insulating layer 160 can further have at least one contact window 164 through which the first gate 130 and the second gate 150 are connected, such that the first and second gates 130 and 150 can have the same bias voltage.

It should be mentioned that the configuration of the gate insulating layer 160 is not limited in the invention. The gate insulating layer 160 embodied herein has the third through hole 162 and the contact window 164, while the gate insulating layer 160 in other embodiments of the invention can have no contact window 164. That is to say, the first gate 130 and the second gate 150 are not connected to each other, and different bias voltages can be respectively input to the first gate 130 and the second gate 150, thus leading to different electric effects. In brief, the vertical transistor structure 100 depicted in FIG. 1B is exemplary and should not be construed as a limitation to the invention.

Based on the descriptions in the previous embodiments, people having ordinary skill in the pertinent art can, based on actual requirements, select the afore-mentioned components for achieving desirable technical effects in other embodiments not shown in the drawings.

In light of the foregoing, the semiconductor channel layer described in the embodiments of the invention fills the first through hole of the first gate, the second through hole of the second gate, and the third through hole of the gate insulating layer and extends into the fourth through hole and the fifth through hole. The first, second, third, fourth, and fifth through holes are communicated with one another. Hence, the vertical transistor structure herein can have a relatively high ON current and a relatively long semiconductor channel layer, and the OFF current can be effectively reduced. Namely, by modifying the thickness of the first and second gates, the length of the semiconductor channel layer in the vertical transistor structure can be accurately adjusted, and the problems including short channel effect caused by the reduced physical dimensions of devices can be resolved.

Moreover, due to the oxidation reaction, the first and second passivation layers with high density and high dielectric constant can be formed in the first and second gates, so as to expand the range of the voltages applicable to the vertical transistor structure and increase the ON-OFF current ratio. Additionally, the ring-shaped semiconductor channel layer is encircled by the first and second gates that are made of metallic materials, and therefore external electro-magnetic or noise interference can be reduced or eliminated.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A vertical transistor structure comprising:
    a substrate;
    a source configured on the substrate;
    a first gate configured on the source and having at least one first through hole, the at least one first through hole penetrating the first gate;
    a first insulating layer configured between the first gate and the source;
    a second gate configured on the first gate and having at least one second through hole, the at least one second through hole penetrating the second gate;
    a gate insulating layer configured between the first gate and the second gate and having at least one third through hole, the at least one third through hole penetrating the gate insulating layer, wherein the at least one first through hole, the at least one second through hole, and the at least one third through hole are communicated with one another, the gate insulating layer further has at least one contact window, and the first gate and the second gate are directly physically connected through the at least one contact window;
    a drain configured on the second gate;
    a second insulating layer configured between the second gate and the drain; and
    a semiconductor channel layer filling the at least one first through hole, the at least one second through hole, and the at least one third through hole.

2. The vertical transistor structure as claimed in claim 1, wherein the first insulating layer has at least one fourth through hole, and a portion of the semiconductor channel layer further extends into the at least one fourth through hole.

3. The vertical transistor structure as claimed in claim 1, wherein the second insulating layer has at least one fifth through hole, a portion of the semiconductor channel layer further extends into the at least one fifth through hole, and a portion of the drain is connected to the portion of the semiconductor channel layer in the at least one fifth through hole.

4. The vertical transistor structure as claimed in claim 1, further comprising a first passivation layer configured on an inner wall of the at least one first through hole.

5. The vertical transistor structure as claimed in claim 4, wherein a material of the first passivation layer comprises aluminum oxide.

6. The vertical transistor structure as claimed in claim 1, further comprising a second passivation layer configured on an inner wall of the at least one second through hole.

7. The vertical transistor structure as claimed in claim 6, wherein a material of the second passivation layer comprises aluminum oxide.

8. The vertical transistor structure as claimed in claim 1, wherein the semiconductor channel layer is in a ring shape.

9. The vertical transistor structure as claimed in claim 1, wherein the drain is in a ring shape.

* * * * *